United States Patent
Blaesing-Bangert

(10) Patent No.: US 6,226,087 B1
(45) Date of Patent: May 1, 2001

(54) METHOD FOR MEASURING THE POSITIONS OF STRUCTURES ON A MASK SURFACE

(75) Inventor: Carola Blaesing-Bangert, Huettenberg (DE)

(73) Assignee: Leica Microsystems Wetzlar GmbH, Wetzlar (DE)

( * ) Notice: Subject to any disclaimer, the term of this patent is extended or adjusted under 35 U.S.C. 154(b) by 0 days.

(21) Appl. No.: 09/253,547

(22) Filed: Feb. 22, 1999

(30) Foreign Application Priority Data

Apr. 21, 1998 (DE) .............................. 198 17 714

(51) Int. Cl.[7] .................................................. G01N 11/00
(52) U.S. Cl. ............................................ 356/401; 356/399
(58) Field of Search .................................. 356/399, 400, 356/401

(56) References Cited

U.S. PATENT DOCUMENTS 5,854,819 * 12/1998 Hara et al. ........................... 378/34
6,114,072 * 10/2000 Narimatsu ............................ 430/5
6,118,517 * 10/2000 Sasaki et al. ......................... 355/53

\* cited by examiner

*Primary Examiner*—Robert Kim
*Assistant Examiner*—Andrew H. Lee
(74) *Attorney, Agent, or Firm*—Evenson, McKeown, Edwards & Lenahan, P.L.L.C.

(57) ABSTRACT

A method is provided for measuring structures on a mask surface in which the mask is supported on a measuring stage that is interferometrically measurably displaceable perpendicularly to an optical axis of an image-measuring system. A mask coordinate system associated with the mask is aligned using alignment marks relative to a measuring device coordinate system. With set positions of the structures in the mask coordinate system being specified in advance, the positions of at least two external edges of the mask in the mask coordinate system that are perpendicular to one another are measured in addition to the actual positions of the structures in the mask coordinate system.

21 Claims, 1 Drawing Sheet

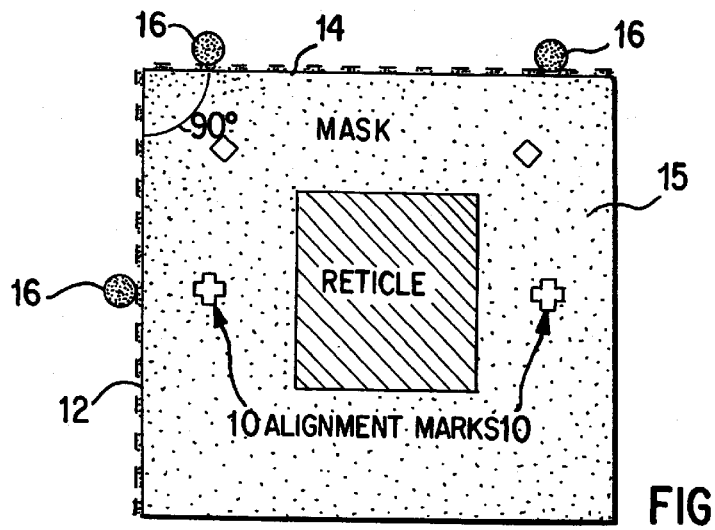
FIG. 1
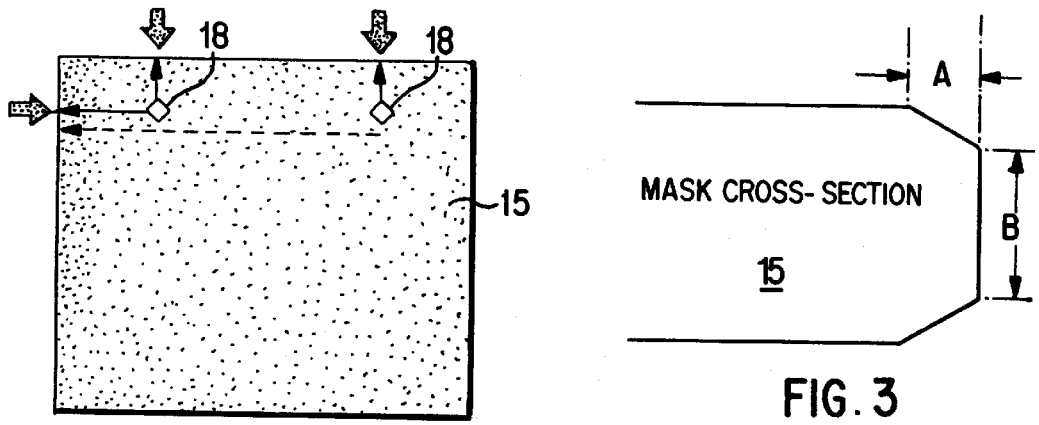
FIG. 2
FIG. 3
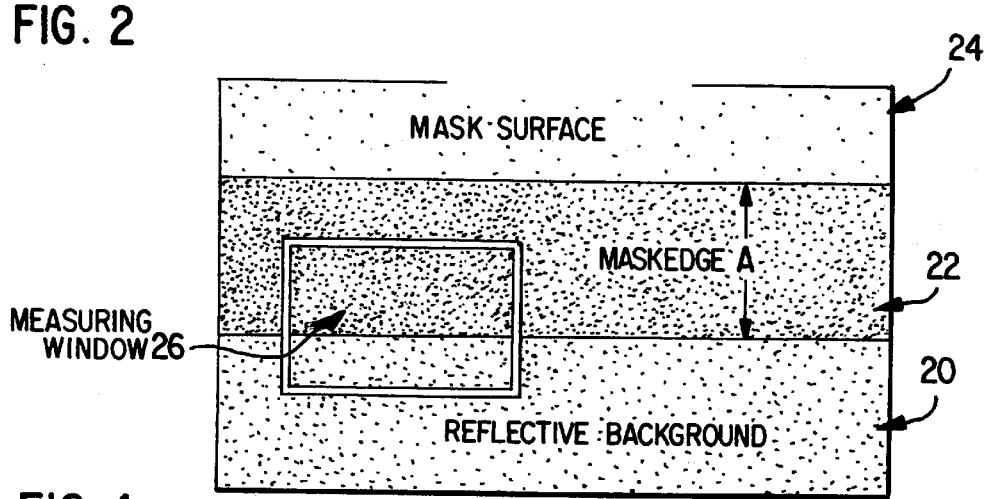
FIG. 4

METHOD FOR MEASURING THE POSITIONS OF STRUCTURES ON A MASK SURFACE

BACKGROUND AND SUMMARY OF THE INVENTION

This application claims the priority of German Application No. 198 17 714.3, filed Apr. 21, 1998, the disclosure of which is expressly incorporated by reference herein.

The invention relates to a method for measuring the positions of structures on a mask surface in which the mask is placed in an image-evaluating coordinate measuring device on a measuring stage that is displaceable in an interferometrically measurable fashion perpendicularly to an optical axis of an image-measuring system. A mask coordinate system associated with the mask is aligned relative to a measuring device coordinate system using alignment marks. The set position of the structures in the mask coordinate system is determined in advance.

A measuring device for performing such a method is described in the manuscript of a paper entitled "Pattern Placement Metrology for Mask Making", by Dr. C. Bläsing, Semicon Genf, Education Program, issued on Mar. 31, 1998, the disclosure of which is incorporated by reference herein. One known commercially available measuring device of this type is the Leica LMS IPRO® system. The measuring device serves in particular for quality control of masks used to manufacture semiconductors. The quality of the mask is becoming increasingly critical in semiconductor chip production. The specifications for the positions of structures (patterns) from one mask to another are becoming increasingly tighter. The measuring device described in the text of the above-mentioned paper can measure the positions of structures relative to specific alignment marks that define the mask coordinate system with a typical accuracy of better than 10 nm. With the aid of these alignment marks, the masks can then be aligned in a stepper for projection on wafer surfaces. Errors made in this process must be accounted for directly in the so-called "error budget" of the lithography process. The mask is aligned in the stepper so that when the respective alignment marks on the mask are illuminated, they are located exactly on top of one another. The steppers however have only one specific area around which the mask can be displaced and rotated for physical alignment.

With ever increasingly strict specifications for all components, the position of the structures on the mask relative to the outer edge of the mask is also becoming an important quality feature of the mask. The positions of the structures relative to the outer edges are termed "centrality" or also "pattern centrality."

The mask is usually located in the lithography device (E-beam or laser lithography for example) using three points (such as banking points or "pins", in order to obtain a reproducible position. Two outer edges of the mask are established with the three points, assuming that these edges are at right angles to one another. These two edges form a reference for the pattern generated by the structures.

Previously, "pattern centrality" was not very significant. This was because the tolerances in the stepper mounts for the masks were so great that the accuracy of the mask lithograph systems met the specifications even without additional measurements. Samples were only randomly measured for pattern centrality for process control purposes. Normal microscopes were used for this purpose, which microscopes were adapted to have the same contact points (typically three) as the lithography systems. The masks were then placed manually by the operator on the microscope stage against the contact points. Special "centrality marks" written on the mask are then measured manually under the microscope relative to the edges of the mask. Provided the distances to the edges remain within a predetermined tolerance range, sufficient alignment of the mask in the stepper with the aid of the alignment marks is guaranteed. The accuracy requirements for measurement are not very high.

With each new chip generation, however, the requirements for accuracy and measuring throughput increase constantly. The accuracy that can be achieved with manual measurement using a conventional microscope is no longer sufficient. Moreover, in manual measurement, too much time is expended on alignment of the mask in the measuring device, finding or locating the structures, and the actual measurement itself. In addition, the mask must be removed from a carrier housing for each measurement in a separate measuring device (the microscope) and, after the measurement, must again be carefully stored in the carrier housing. Each handling process increases the danger of contamination and damage to the mask, such as may occur when placing the mask against the contact points or pins.

Hence, the goal of the invention is to provide a measurement method with which "pattern centrality" can be determined with higher accuracy, increased speed, and reduced risk of damage to the mask.

This goal is achieved according to the present invention by a method of the above-mentioned type wherein in addition to the actual positions of the structures on the mask relative to the mask coordinate system, the positions of at least two external edges of the mask, perpendicular to one another, are measured in the mask coordinate system. Advantageously, the positions of the outside edges of the mask are determined on one coordinate axis from the value of the edge position measured by image evaluation and, on the other coordinate axis, by the current measuring stage position. When two position values are determined for one external edge, and at least one position value for the other external edge, assuming that the external edges are perpendicular to one another, two reference lines can be determined for establishing "centrality."

Advantageously, the positions of the other edges can also be measured, so that it is possible to check the tolerances in the mask plate dimensions, and the alignment of the structures in the mask surface relative to the true center of the mask can be determined.

Since the method uses an image-evaluating measuring system (as opposed to a conventional manual microscope), an image of the external edge of the mask can be stored in the measuring device and an edge position to be measured can be set in an automatic search of the measuring stage. To measure the position of the external edge, imaging optics with a low aperture are advantageously used. If the measuring stage surface is made to reflect, at least in the area of the external edges of the superimposed mask for the imaging beams of the measuring device, then the edge is illuminated in reflected light and sufficient light intensity enters the measuring system to determine the edge of the mask.

By relying on the conventional method for determining "pattern centrality" selected structural elements can be provided on the mask whose positions in the mask coordinate system and relative to the external edges of the mask are determined. However, the positions of all the measured structures relative to the external edges can also be determined according to the invention without special "centrality marks" being provided.

Instead of the position coordinates, the distances to the external edges of the mask can be determined for both the selected structural elements and for the other measured structures.

Advantageously, the present invention is able to measure pattern centrality with greater accuracy in only seconds while eliminating the use of contact or banking points and the need to manually move the mask to a measuring microscope. This further advantageously saves space in the clean room by eliminating the need for the microscope, which is an additional component otherwise necessary in the semiconductor manufacturing process.

Other objects, advantages and novel features of the present invention will become apparent from the following detailed description of the invention when considered in conjunction with the accompanying drawings.

BRIEF DESCRIPTION OF THE DRAWINGS

FIG. 1 is a diagram illustrating a conventional mask layout arranged against contactor banking points in a lithography system;

FIG. 2 is a diagram of a mask with two centrality marks;

FIG. 3 is a cross-sectional diagram of a typical design of a mask edge; and

FIG. 4 is a typical image of a mask edge obtained by an imaging system according to the invention.

DETAILED DESCRIPTION OF THE DRAWINGS

FIG. 1 is an exemplary diagram of a conventional mask layout. The mask plate shown contains in a central area the mask structures (reticle) produced in a lithography system. Alignment marks 10 are applied in the free area outside of the reticle. Two external edges 12, 14 of the mask plate 15 must be at a right angle to one another. These edges abut at three contact points 16. The dashed lines form the reference for the pattern centrality.

FIG. 2 illustrates a mask plate 15 having separately applied centrality marks 18. The distances to the two external edges that serve as references are indicated by arrows. In FIG. 3, a mask plate 15 is shown in its edge area in cross section. The edges are typically beveled, with the specified distance A usually varying between 0.2 and 0.6 mm.

To perform the method according to the invention, the mask is loaded in the coordinate-measuring system on a measuring stage. Then, an alignment is initially performed by which the mask is aligned with the coordinate system of the measuring device and the mask coordinate system is defined. In the next step, the external edges of the mask are measured.

For this purpose, the measuring stage is moved to the position at which the edge is to be measured. At least at the edge position, the background of the mask should be highly reflective such that sufficient light will pass through imaging optics of the measuring device having a small aperture after reflecting off of this background and into the image-evaluating camera of the measuring device. FIG. 4 shows an image of this kind detected by the camera, such as a CCD camera. The area 20 outside of the mask has a bright surface due to the reflective background. The edge 22 of the mask itself is very dark, since the beveled surface causes the incident light beams to be reflected out of the aperture range of the imaging objective. The surface 24 of the mask also reflects light into the objective lens of the imaging optics. The degree of brightness depends on the type of mask. Because of the typical brightness distribution at the external edge of the mask plate 15, this image can also be stored and used for image recognition in an automatic search of the measuring stage.

When the measuring stage has reached its specified, or automatically found, measuring position, the exact position of the edge is measured. The edge measurement is performed with the aid of an image analysis method within the measuring window 26 indicated in the image field of view. The accuracy of the measurement depends on the resolution of the image-recording system, such as the CCD camera for example. The measured value of the edge position is then stored as the edge position on one coordinate axis and the current interferometrically measured stage position is stored on the other coordinate axis.

In this manner, at least three points are measured on two external edges of the mask plate that are at right angles to one another. Of course, it is also possible to measure the positions of all the external edges as well.

In the next step, the positions of the centrality marks 18 are measured. For this purpose, two opposite edges of a respective mark are measured and the midpoint or center line is determined. The intersection of two center lines that are perpendicular to one another determines the position (coordinate position) of the mark. These marks do not differ in structure from alignment marks or conventional measuring structures. Therefore, any structure that can normally be measured can be used in the method according to the invention as a centrality mark. Thus, any number of structures can be defined as centrality marks. The design positions (set positions), the measuring positions, and the number of marks can be defined in a customer specific manner for each measuring process.

The values obtained for the edge positions and the positions of the measured centrality structures are stored in a measurement data file and are therefore available for further evaluations. A separate data file can be organized for centrality evaluation as well.

Further evaluation can be conducted in a customer-specific manner using suitable evaluation software. The evaluation can consist of, among other things, calculating the distances between the structures relative to the edges. However, shifts in the center of gravity, rotation, orthogonality, etc. of the measured structures relative to the external edges can also be evaluated.

For this purpose, it is advantageous for the positions of all the external edges to be known. In particular, the external dimensions of the mask plate can also be checked.

The method according to the invention not only expands the application areas of the known measuring device, but it also permits a new design for mask structures. This is advantageous because when the mask surface is more densely populated with structures, the centrality marks can be added at any point on the mask, or selective structures can be defined from the regular mask structure as centrality marks that could not otherwise be evaluated as such using conventional measurement methods with a manually operated microscope.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for measuring structures on a mask surface in which a mask is placed in an image-evaluating coordinate-measuring device on a measuring stage that is shiftable in an interferometrically measurable fashion perpendicularly to an optical axis of an image-measuring system, and a mask coordinate system associated with the mask is aligned via alignment marks relative to a measuring device coordinate system of the measuring device, with set positions of structures on the mask surface in the mask coordinate system being specified in advance, wherein in addition to actual positions of the structures in the mask coordinate system, the positions of at least two external edges of the mask that are perpendicular to one another are measured in the mask coordinate system.

2. The method according to claim 1, wherein the position of at least one external edge is determined on one coordinate axis from a value of an edge position measured by image evaluation and on the other coordinate axis from a current measuring stage position value.

3. The method according to claim 2, wherein two position values are determined for one of the at least two external edges and at least one position value is determined for another of the external edges.

4. The method according to claim 1, wherein an image of the external edge is stored in the coordinate-measuring device and an edge position to be measured is set in an automatic search of the measuring stage.

5. The method according to claim 1, wherein the measurement of the positions of the external edges is performed with imaging optics having a small aperture.

6. The method according to claim 1, wherein the measuring stage has a reflecting surface, at least in a vicinity of the external edges of the mask mounted thereon, for reflecting imaging beams of the measuring device.

7. The method according to claim 1, wherein selected structural elements are provided on the mask, whose positions are determined in the mask coordinate system and relative to the external edges of the mask.

8. The method according to claim 1, wherein the position of any measured structure is determined, also relative to the external edges of the mask.

9. The method according to claim 7, wherein distances from the selected structural elements to the two external edges of the mask are determined.

10. The method according to claim 8, wherein distances between any of the measured structures and the two external edges of the mask are determined.

11. The method according to claim 1, wherein different evaluations, including shifts in the center of gravity, rotation, or orthogonality of the structural pattern relative to the two external edges of the mask are performed using stored position coordinates of the structures and the edge positions.

12. The method according to claim 1, wherein the positions of three or more external edges of the mask are measured in the mask coordinate system to be able to check tolerances in the dimensions of the mask plate and to determine an alignment of the structures relative to a true center of the mask.

13. A mask parameter measuring method, comprising the acts of:

arranging a mask having a mask coordinate system on a measuring stage in an image evaluating coordinate measuring device having a measuring device coordinate system;

aligning the mask coordinate system with the measuring device coordinate system; and measuring positions of structures on the mask and a position of at least one external edge of the mask in the mask coordinate system using the image evaluating coordinate measuring device.

14. The method according to claim 13, wherein the act of measuring is carried out without removing the mask from the measuring stage.

15. The method according to claim 13, wherein the act of measuring the at least one external edge of the mask comprises the act of determining an external edge on one coordinate axis from an edge position value measured by the image evaluating coordinate measuring device and on the other coordinate axis from a current measuring stage position value of the measuring stage.

16. The method according to claim 15, wherein two external edges of the mask perpendicular to one another are measured, two position values being determined for one of the two external edges and at least one position value being determined for the other of the two external edges.

17. The method according to claim 13, wherein positions of three or more external edges of the mask are measured to be able to check tolerances in the dimensions of the mask plate and to determine an alignment of the structures relative to a true center of the mask.

18. A system for measuring mask parameters of a mask having a mask coordinate system, comprising:

an image-evaluating coordinate measuring device having imaging optics, and including a measuring stage adapted to receive the mask; and wherein the measuring device aligns the mask coordinate system with a measuring device coordinate system, and measures both positions of structures on the mask and positions of at least two external edges of the mask that are perpendicular to one another in the mask coordinate system.

19. The system according to claim 18, wherein the measuring device measures both the positions of the structures and the at least two external edges using the same imaging optics.

20. The system according to claim 18, wherein both the positions of the structures and the at least two external edges are measured without removing the mask from the measuring stage.

21. The system according to claim 18, wherein positions of three more edges of the mask are measured to be able to check tolerances in the dimensions of the mask plate and to determine an alignment of the structures relative to a true center of the mask.

* * * * *